US009134352B2

(12) United States Patent
Huang et al.

(10) Patent No.: US 9,134,352 B2
(45) Date of Patent: Sep. 15, 2015

(54) CURRENT DETECTING CIRCUIT, TEMPERATURE COMPENSATING DEVICE AND DISPLAY DEVICE (71) Applicants: BOE Technology Group Co., Ltd., Beijing (CN); Hefei BOE Optoelectronics Technology Co., Ltd., Anhui (CN)

(72) Inventors: Shanshan Huang, Beijing (CN); Min Wang, Beijing (CN); Chunyang Nie, Beijing (CN)

(73) Assignees: BOE Technology Group Co., Ltd., Beijing (CN); Hefei BOE Optoelectronics Technology Co., Ltd., Hefei, Anhui (CN)

( * ) Notice: Subject to any disclaimer, the term of this patent is extended or adjusted under 35 U.S.C. 154(b) by 167 days.

(21) Appl. No.: 14/086,439

(22) Filed: Nov. 21, 2013

(65) Prior Publication Data
US 2014/0159998 A1 Jun. 12, 2014

(30) Foreign Application Priority Data

Dec. 11, 2012 (CN) .......................... 2012 1 0533320

(51) Int. Cl.
G01R 19/32 (2006.01)
G09G 3/36 (2006.01)
G01R 19/00 (2006.01)

(52) U.S. Cl.
CPC ............ *G01R 19/32* (2013.01); *G01R 19/0092* (2013.01); *G09G 3/3648* (2013.01); *G09G 2320/041* (2013.01)

(58) Field of Classification Search
None
See application file for complete search history.

(56) References Cited

U.S. PATENT DOCUMENTS 5,365,129 A * 11/1994 Slemmer et al. ................ 327/65
8,373,491 B2 * 2/2013 Van Den Bos et al. ....... 327/403
(Continued)

FOREIGN PATENT DOCUMENTS

CN 1372432 A 10/2002
CN 1412633 A 4/2003
(Continued)

OTHER PUBLICATIONS

Notification of the First Office Action from Chinese Patent Office for priority application 201210533320.4 dated Jul. 18, 2014 with English translation.

*Primary Examiner* — Antonio Xavier
(74) *Attorney, Agent, or Firm* — Frommer Lawrence & Haug LLP (57) ABSTRACT

The invention discloses a current detecting circuit, a temperature compensating device and a display device, and relates to the field of display technology, which resolves the problem of image flicker in the display screen or abnormal display due to changes in the turn-on voltage of the thin film transistors in the display panel caused by changes in the temperature in the prior art. The current detecting circuit includes a voltage source, a first mirror current source for supplying a reference current, a second mirror current source for obtaining a difference between a current output from the first mirror current source and a current output from a unit to be detected and converting the difference into a voltage signal, and an inverter for amplifying the voltage signal and output a detection result. A temperature compensating device including the foregoing current detecting circuit. A display device including the above temperature compensating device.

17 Claims, 2 Drawing Sheets (56) References Cited

U.S. PATENT DOCUMENTS

| | | | |
|---|---|---|---|
| 8,525,437 B2* | 9/2013 | Sung et al. | 315/291 |
| 2004/0217934 A1* | 11/2004 | Yang | 345/100 |
| 2005/0035933 A1* | 2/2005 | Mas et al. | 345/84 |
| 2007/0182671 A1* | 8/2007 | Nathan et al. | 345/76 |
| 2008/0062106 A1* | 3/2008 | Tseng | 345/92 |
| 2008/0157820 A1* | 7/2008 | Hastings | 327/78 |
| 2010/0090748 A1* | 4/2010 | Ito | 327/512 |

FOREIGN PATENT DOCUMENTS

| | | |
|---|---|---|
| CN | 1532791 A | 9/2004 |
| CN | 1684351 A | 10/2005 |
| CN | 101963629 A | 2/2011 |
| JP | 63-91572 A | 4/1988 |
| JP | 10-132601 A | 5/1998 |

\* cited by examiner

CURRENT DETECTING CIRCUIT, TEMPERATURE COMPENSATING DEVICE AND DISPLAY DEVICE

FIELD OF THE INVENTION

The present invention relates to the field of display technology, and particularly to a current detecting circuit, a temperature compensating device and a display device.

BACKGROUND OF THE INVENTION

Figure 1:
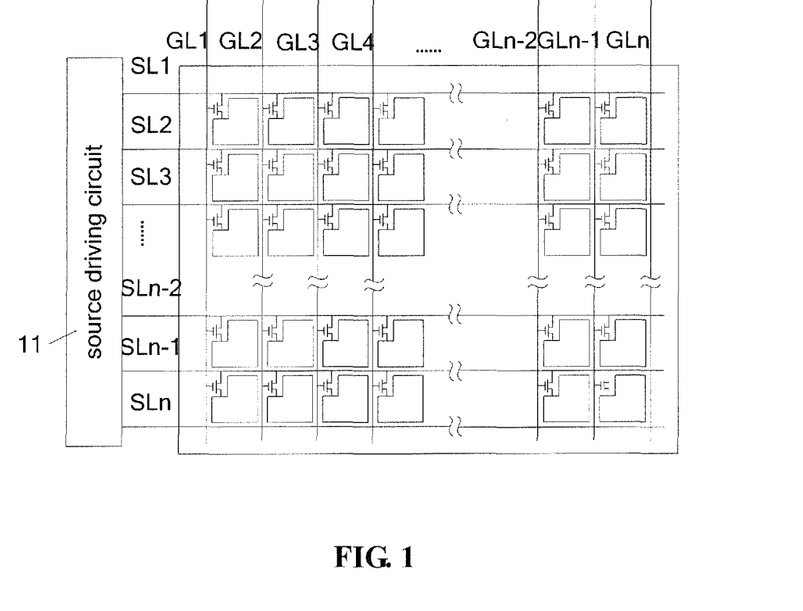
FIG. 1 is a top view of structure of a display panel in the prior art.

A liquid crystal display (LCD) device uses a LCD panel to display images. As shown in FIG. 1, a display panel in the prior art includes a display area and a non-display area. In the display area, there are provided gate lines (GL1-GLn), data lines (DL1-DLn), and a plurality of pixel units in array arrangement defined by GL (Gate Line) and DL (Data Line). Each pixel unit includes a thin film transistor (TFT) and a pixel electrode, the thin film transistor includes a gate (G), a source (S) and a drain (D), wherein the gate G is connected to gate line GL, the source S is connected to the data line DL, and the drain D is connected to the pixel electrode. In the non-display area, there are provided a gate driving circuit 10 and a source driving circuit 11, the gate driving circuit 10 supplies a voltage to gates through the gate lines GL, the source driving circuit 11 supplies a voltage to sources through data lines DL.

The display panel operates as follows: for a thin film transistor for driving pixel unit, that is, a driving thin film transistor, when a voltage applied to the gate G reaches a turn-on voltage (that is, a threshold voltage, which is a critical voltage applied to the gate so that the source and drain of the thin film transistor begins to turn on), the source S and the drain D enter into a turn-on state, a voltage may be obtained from the pixel electrode which is electrically connected to the drain D, and the liquid crystal molecules are deflected due to a electric field generated by the voltage so that display is performed. However, the turn-on voltage of the driving thin film transistor is not constant, but varies with the temperature, and if there is a deviation between the turn-on voltage and a set turn-on voltage of the driving thin film transistor due to changes in temperature, the deviations are different between various temperature areas. In the prior art, as the voltage supplied to the gate from a gate driving circuit is constant, image flicker is likely to occur in the display panel or the display panel may not display normally. Therefore, a temperature compensating device is needed so as to correct the deviations in the turn-on voltage of the driving thin film transistors due to changes in temperature, so as to avoid the image flicker or abnormal display in the display panel.

The temperature compensating device in the prior art includes a detection unit for detecting the temperature of the display panel. The detection unit includes a thermistor. As the resistance of the thermistor varies with the temperature, the temperature of the display panel may be obtained based on the change in resistance of the thermistor. In the prior art, the temperature compensating device is generally provided on an additional control plate which is adjacent to the display panel to detect the temperature of the display panel. As the additional control plate is separated from the display panel, a temperature detected by the detection unit provided on the addition control plate can not reflect the real temperature of the display panel in time. Also, the result of the thermistor is affected by the manufacturing process, thus it is difficult for the temperature compensating device to accurately correct the deviation in turn-on voltage of the thin film transistor due to changes in temperature.

SUMMARY OF THE INVENTION

Embodiments in the invention provide a current detecting circuit, a temperature compensating device and a display device. The current detecting circuit is configured to reflect changes in current of the unit to be detected, and when the current detecting circuit is used in the display panel, it can reflect the changes in current of the display panel. The temperature compensating device is configured to detect the changes in temperature of the display panel and correct the turn-on voltage of the driving thin film transistor in the display panel based on the changes in temperature.

To achieve above object, embodiments in the invention adopt following solution:

A embodiment in the invention provides a current detecting circuit for detecting current of a unit to be detected, which comprises a voltage source, a first mirror current source, a second mirror current source and an inverter, wherein the first mirror current source is configured to provide a reference current, and includes an input terminal, an output terminal and a ground terminal, wherein the input terminal is electrically connected to the voltage source, and the output terminal is electrically connected to the second mirror current source;

the second mirror current source is configured to obtain a difference between a current output from the first mirror current source and a current output from the unit to be detected and converters it into a voltage signal, and includes a first input terminal, a second input terminal, a output terminal and a ground terminal, wherein the first input terminal of the second mirror current source is electrically connected to the output terminal of the first mirror current source and electrically connected to the output terminal of the unit to be detected, and the second input terminal is electrically connected to the voltage source;

the inverter is configured to amplify the voltage signal and output a detection result, and includes a first input terminal, a second input terminal, an output terminal and a ground terminal, wherein the first input terminal of the inverter is electrically connected to the voltage source, the second input terminal of the inverter is electrically connected to the output terminal of the second mirror current source, and the output terminal of the inverter functions as an output terminal of the current detecting circuit.

Preferably, the first mirror current source includes a first thin film transistor, a second thin film transistor and a third thin film transistor, wherein the gate and the source of the first thin film transistor are electrically connected together to function as the input terminal of the first mirror current source, the drain of the first thin film transistor is electrically connected to the gate and the source of the second thin film transistor respectively;

the gate of the second thin film transistor is electrically connected to the gate of the third thin film transistor, the drain of the second thin film transistor and the drain of the third thin film transistor are electrically connected together to function as the ground terminal of the first mirror current source; and the source of the third thin film transistor functions as the output terminal of the first mirror current source.

Preferably, the second mirror current source includes a forth thin film transistor, a fifth thin film transistor and a sixth thin film transistor, wherein the gate and the source of the forth thin film transistor are electrically connected together to function as the first input terminal of the second mirror current source, the gate of the forth thin film transistor is electrically connected to the gate of the fifth thin film transistor, the drain of the forth thin film transistor and the drain of the fifth thin film transistor are electrically connected together to function as the ground terminal of the second mirror current source;

the source of the fifth thin film transistor and the drain of the sixth thin film transistor are electrically connected together to function as the output terminal of the second mirror current source; and the gate and the source of the sixth thin film transistor are electrically connected together to function as the second input terminal of the second mirror current source.

Preferably, the inverter includes a seventh thin film transistor and a eighth thin film transistor, wherein the source of the seventh thin film transistor functions as the first input terminal of the inverter, the gate of the seventh thin film transistor and the gate of the eighth thin film transistor are electrically connected together to function as the second input terminal of the inverter, the drain of the seventh thin film transistor and the source of the eighth thin film transistor are electrically connected to function as the output terminal of the inverter, the drain of the eighth thin film transistor functions as the ground terminal of the inverter.

A temperature compensating device, which includes a temperature compensating module, a control chip, and the foregoing current detecting circuit, wherein the input terminal of the temperature compensating module is electrically connected to the output terminal of the current detecting circuit, and is configured to calculate a corrected voltage value based on a detection result output from the output terminal of the current detecting circuit, and output the corrected voltage value to the control chip; and the control chip controls the output of corrected voltage based on the corrected voltage value.

Preferably, the temperature compensating module includes a analog-digital converter and a calculating unit, the input terminal of the analog-digital converter functions as the input terminal of the temperature compensating module and is configured to convert the detection result of the current detecting circuit into a digital signal and output the digital signal to the calculating unit.

The calculating unit is configured to calculate the corrected voltage value based on the digital signal.

A display device includes a display panel and the above temperature compensating device.

Preferably, the display panel includes a display area and a non-display area, a plurality of pixel units are provided in the display area, each pixel unit includes a driving thin film transistor for driving the pixel unit, the unit to be detected is formed in the display area, and the unit to be detected functions as a ninth thin film transistor which has same structure and parameters as those of the driving thin film transistor respectively.

Preferably, a gate driving circuit is further provided in the non-display area, the gate of the ninth thin film transistor is electrically connected to the gate driving circuit, the source of the ninth thin film transistor is electrically connected to the voltage source, and the drain of the ninth thin film transistor functions as the output terminal of the unit to be detected and is electrically connected to the input terminal of the current detecting circuit.

Preferably, the current detecting circuit is provided in the non-display area, and the first thin film transistor to the eighth thin film transistor in the current detecting circuit have same structure and parameters as those of the driving thin film transistor respectively.

The invention provides a current detecting circuit, a temperature compensating device and a display device. If the current detecting circuit is used in a display panel, it can used to reflect change in temperature of the display panel. The temperature compensating device can detect the change in temperature of the display panel through the current detecting circuit, calculates a corrected voltage value, then controls the gate driving circuit to output a corrected voltage by means of the control chip, so that an object of correcting the turn-on voltage of the driving thin film transistor in the display panel can be realized.

BRIEF DESCRIPTION OF THE DRAWINGS

In order to explain embodiments in the invention or solutions in the prior art more clearly, hereinafter will simply describe drawings used in the embodiments in the invention or descriptions for the prior art. Obviously, drawings described below are just some certain embodiments of the invention, and a skilled in the art may obtain other drawings based on these drawings without inventive labor.

REFERENCE NUMBERS

1—the current detecting circuit; 2—the temperature compensating module; 3—the control chip; 10—the gate driving circuit; 11—the source driving circuit; 100—the voltage source; 101—the first mirror current source; 102—the second mirror current source; 103—the inverter; 104—the unit to be detected; 201—the analog-digital converter unit; 202—the calculating unit; T1—the first thin film transistor; T2—the second thin film transistor; T3—the third thin film transistor; T4—the forth thin film transistor; T5—the fifth thin film transistor; T6—the sixth thin film transistor; T7—the seventh thin film transistor; T8—the eighth thin film transistor; T9—the ninth thin film transistor; G—gate; S—source; D—drain; GL—gate line.

DETAILED DESCRIPTION OF THE EMBODIMENTS

Hereinafter, the solutions in the invention will be described clearly and completely with reference to drawings. It is apparent that the described embodiments just some but not all of the embodiments of the invention.

Figure 2:
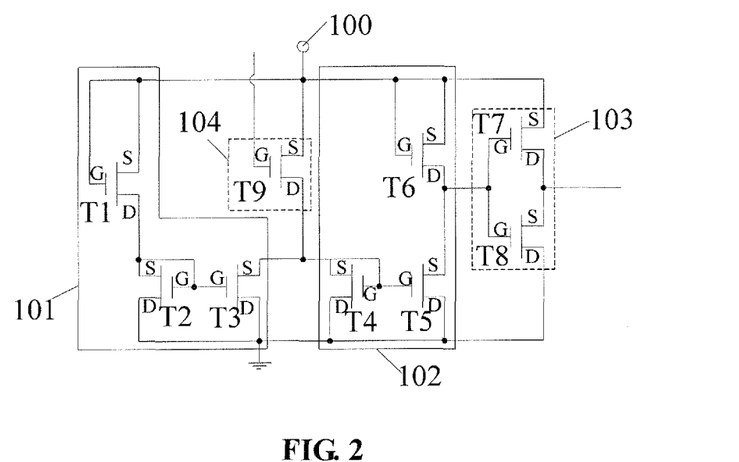
FIG. 2 is a diagram of a current detecting circuit according to an embodiment in the invention.

As shown in FIG. 2, an embodiment in the invention provides a current detecting circuit for detecting the current of a unit to be detected, which comprises a voltage source 100, a first mirror current source 101, a second mirror current source 102 and an inverter 103, wherein the first mirror current source 101 is configured to provide a reference current, and includes an input terminal, an output terminal and a ground terminal, wherein the input terminal is electrically connected to the voltage source 100, and the output terminal is electrically connected to the second mirror current source 102;

the second mirror current source 102 is configured to obtain a difference between a current output from the first mirror current source 101 and a current output from the unit to be detected 104 and converters it into a voltage signal, and includes a first input terminal, a second input terminal, a output terminal and a ground terminal, wherein the first input terminal is electrically connected to the output terminal of the first mirror current source 101 as the input terminal of the current detecting circuit, and electrically connected to the output terminal of the unit to be detected 104, and the second input terminal is electrically connected to the voltage source 100;

the inverter 103 is configured to amplify the voltage signal and output a detection result, and includes a first input terminal, a second input terminal, an output terminal and a ground terminal, wherein the first input terminal is electrically connected to the voltage source 100, the second input terminal is electrically connected to the output terminal of the second mirror current source 102, and the output terminal of the inverter functions as a output terminal of the current detecting circuit 1.

The voltage source 100 is configured to generate a fixed voltage, the first mirror current source 101 is configured to generate a reference current, and the current input into the second mirror current source 102 is a difference current between the current output from the first mirror current source 101 and the current output from the unit to be detected 104. If a current to be detected (i.e., the current output from the unit to be detected 104) is larger than the reference current (i.e., the current output from the first mirror current source 101), the inverter 103 outputs a high level voltage, and if the current to be detected is smaller than the reference current, the inverter 103 outputs a low level voltage.

An embodiment in the invention provides a current detecting circuit, wherein the first mirror current source 101 may generate a reference current, the unit to be detected 104 outputs the current to be detected, the current input into the second mirror current source 102 is a difference current between the current output from the first mirror current source 101 and the current to be detected. If the current to be detected is larger than the reference current, the inverter 103 outputs a high level voltage, and if the current to be detected is smaller than the reference current, the inverter 103 outputs a low level voltage. Hence, the current detecting circuit may detect the changes in current output from the unit to be detected 104.

An embodiment in the invention provides a current detecting circuit, which may be applicable to detect the current in display devices and other electronic devices. Hereinafter, an embodiment in the invention will be described by taking a detection applied to the current in the driving thin film transistor in the display device as an example.

Specifically, as shown in FIG. 2, the first mirror current source 101 includes a first thin film transistor T1, a second thin film transistor T2 and a third thin film transistor T3, wherein the gate G and the source S of the first thin film transistor T1 are electrically connected together to function as the output terminal of the first mirror current source 101 connected electrically to the voltage source 100, and the drain D of the first thin film transistor T1 is electrically connected to the gate G and the source S of the second thin film transistor T2 respectively;

the gate G of the second thin film transistor T2 is electrically connected to the gate G of the third thin film transistor T3, the drain D of the thin film transistor T2 is electrically connected to the drain D of the third thin film transistor T3 to function as the ground terminal of the first mirror current source 101; and the source S of the third thin film transistor T3 functions as the output terminal of the first mirror current source 101, and may output a reference current. The reference current may be the drain current of the driving thin film transistor in turn-on state when the display panel operates in normal temperature.

Specifically, as shown in FIG. 2, the second mirror current source 102 includes a forth thin film transistor T4, a fifth thin film transistor T5 and a sixth thin film transistor T6, wherein the gate G and the source S of the forth thin film transistor T4 are electrically connected together to function as the first input terminal of the second mirror current source 102, which is electrically connected to the output terminal of the first mirror current source 101, the gate G of the forth thin film transistor T4 is electrically connected to the gate G of the fifth thin film transistor T5, and the drain D of the forth thin film transistor T4 and the drain D of the fifth thin film transistor T5 are electrically connected together to function as the ground terminal of the second mirror current source 102;

the source S of the fifth thin film transistor T5 and the drain D of the sixth thin film transistor T6 are electrically connected together to function as the output terminal of the second mirror current source 102, which is electrically connected to the second input terminal of the inverter 103; and the gate D and the source S of the sixth thin film transistor T6 are electrically connected together to function as the second input terminal of the second mirror current source 102, which is electrically connected to the voltage source 100.

Specifically, as shown in FIG. 2, the inverter 103 includes a seventh thin film transistor T7 and a eighth thin film transistor T8, wherein the source S of the seventh thin film transistor T7 functions as the first input terminal of the inverter 103 and is electrically connected to the voltage source 100, the gate G of the seventh thin film transistor T7 and the gate G of the eighth thin film transistor T8 are electrically connected together to function as the second input terminal of the inverter 103, which is electrically connected to the output terminal of the second mirror current source 102, the drain D of the seventh thin film transistor T7 and the source S of the eighth thin film transistor T8 are electrically connected together to function as the output terminal of the inverter 103 for outputting a detection result, and the drain D of the eighth thin film transistor T8 functions as the ground terminal of the inverter 103.

The output terminal of the unit to be detected 104 is connected to the source S of the third thin film transistor T3 and the source S and the gate G of the forth thin film transistor T4. The third thin film transistor T3 and the forth thin film transistor T4 form a current differential amplifier circuit, so that the current input into the second mirror current source 102 is a difference current between the current output from the first mirror current source 101 (i.e., the reference current) and the current output from the unit to be detected 104 (i.e., the current to be detected), thus the second mirror current source 102 corresponds to a current comparator. If the current to be detected is larger than the reference current, the inverter 103 outputs a high level voltage, and if the current to be detected is smaller than the reference current, the inverter 103 outputs a low level voltage.

Figure 3:
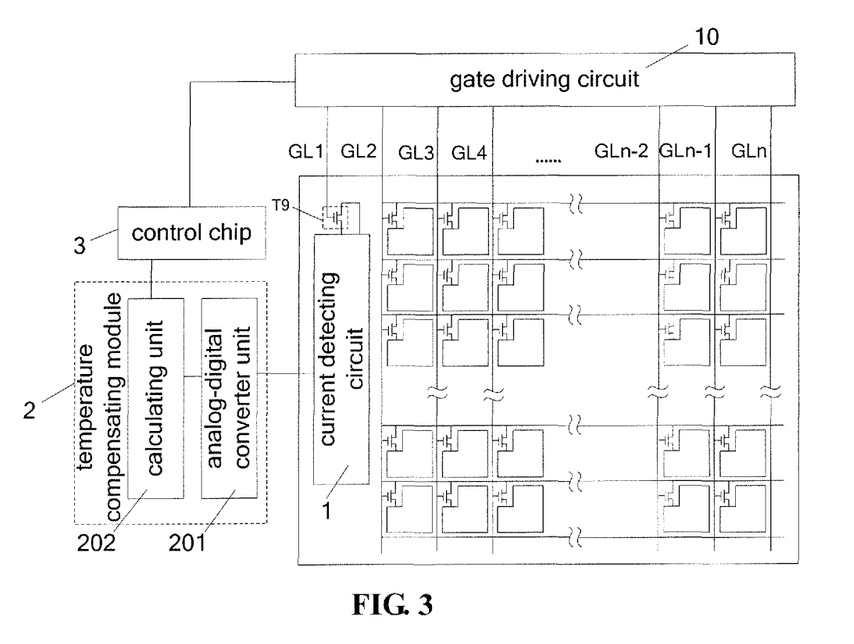
FIG. 3 is a diagram of applying the temperature compensating device in the invention to the display panel.

Alternatively, as shown if FIG. 3, the current detecting circuit may be provided on the display panel, and the first thin film transistor T1 to the eighth thin film transistor T8 in the current detecting circuit are the same as the driving thin film transistors in pixel units on the display panel in structure and parameters respectively, so as to the first thin film transistor T1 to the eighth thin film transistor T8 in the current detecting circuit 1 can be manufactured at the time of fabricating the driving thin film transistors in the pixel units on the display panel.

The unit to be detected 104 supplies the current to be detected. The output terminal of the unit to be detected 104 is electrically connected to the current detecting circuit 1, the first mirror current source 101 in the current detecting circuit 1 supplies a reference current set based on a desired current for the unit to be detected 104, the second mirror current source 102 in the current detecting circuit 1 obtains the difference value between the current to be detected and the reference current through receiving the current to be detected and comparing it with the reference current, then the inverter 103 of the current detecting circuit 1 outputs a high level voltage or a low level voltage based on the difference value. Therefore, when the current detecting circuit in the invention is applied to display panels, in order to enable the current output from the unit to be detected 104 to accurately reflect the changes in the temperature of the display panel, it is preferably to providing the unit to be detected 104 on the display panel, meanwhile, the current detecting circuit 1 may be provided either on the display panel or on a additional control plate, such as a PCB plate, so long as the current detecting circuit 1 may electrically connects to the unit to be detected 104. Preferably, the current detecting circuit 1 is also provided on the display panel so as to reduce the interference caused in the electrical connection between the current detecting circuit 1 and the unit to be detected 104. When the current detecting circuit 1 and the unit to be detected 104 are provided on the display panel, it is preferable that they are provided in the non-display areas so as not to affect the display of the display panel.

An embodiment in the invention provides a temperature compensating device, which includes a temperature compensating module 2, a control chip 3, and any one of current detecting circuits provided by the embodiments in the invention, wherein the input terminal of the temperature compensating module 2 is electrically connected to the output terminal of the current detecting circuit 1, and is configured to calculate a corrected voltage value based on a detection result output from the output terminal of the current detecting circuit 1, and output the corrected voltage value to the control chip 3; and the control chip 3 is configured to control the gate driving circuit 10 to output a corrected voltage so as to control the driving thin film transistors in pixel units.

The corrected voltage value corresponds to a turn-on voltage of the driving thin film transistor, which allows the driving thin film transistor to operate normally even when the temperature of the display panel increase or decrease. The temperature compensating module 2 may be a TC (Temperature Compensation) module. The control chip 3 may be a DC-DC (Direct Current to Direct Current power) chip.

As shown in FIG. 3, a level voltage is output from the current detecting circuit 1 and is input into the temperature compensating module 2, then a corrected voltage value is output from the temperature compensating module 2 based on the level voltage and is input into the control chip 3, the control chip 3 controls the gate driving circuit 10 to output a corrected voltage based on the received corrected voltage value, the corrected voltage being the turn-on voltage of the driving thin film transistors of pixel units in the display panel.

The temperature compensating device provided by the embodiment in the invention may correct the turn-on voltage of the driving thin film transistors in the display panel based on the detection result output from the current detecting circuit 1, preventing flicker in the display screen or abnormal display due to a result that the changes in the turn-on voltage of the driving thin film transistors in the display panel caused by the changes in the temperature can not be accurately corrected in time from occurring.

Alternatively, as shown in FIG. 3, the temperature compensating module 2 includes a analog-digital converter unit 201 and a calculating unit 202, wherein the input terminal of the analog-digital converter unit 201 functions as the input terminal of the temperature compensating module 2, and is configured to convert the detection result of the current detecting circuit 1 into a digital signal and output the digital signal to the calculating unit 202, and the calculating unit 202 is configured to calculate the corrected voltage value based on the input digital signal.

The analog-digital converter 201 may be a ADC (Analog to Digital Converter) chip, and the calculating unit 202 may be a FPGA (Field-Programmable Gate Array) chip.

Specifically, the turn-on voltage of the ninth thin film transistor T9 in the unit to be detected 104 changes due to the changes in temperature of the display panel, thus the drain current of the ninth thin film transistor T9 changes, that is, the ninth thin film transistor T9 functions as a synchronization temperature detector. The changes in the drain current of the ninth thin film transistor T9, the changes in the turn-on voltage of the driving thin film transistor in the display panel due to the changes in temperature, and thus-caused changes in the drain current of the driving thin film transistor are completely consistent with each other in trends. The current detecting circuit 1 detects the changes in the drain current of the ninth thin film transistor T9, and input it into the analog-digital converter unit 201 in the temperature compensating module 2, the analog-digital converter unit 201 then converts the changes in current into a digital signal, and input it into the calculating unit 202. The calculating unit 202 calculates a corrected voltage value based on the digital signal, and then controls the gate driving circuit 10 through the control chip 3 to output a corrected voltage, so as to correct the deviation of the turn-on voltage caused by the changes in temperature.

An embodiment of the invention provides a display device, which includes a display panel and any one of the temperature compensating devices in the invention, wherein a unit to be detected 104 is formed on the display panel. The display device may be a display such as a liquid crystal display, an electronic paper, a OLED (Organic Light-Emitting Diode) display, and a product or a device with display function, such as a TV set, a digital camera, a mobile phone, which include above display devices.

Alternatively, as shown in FIGS. 2 and 3, the unit to be detected 104 is the ninth thin film transistor T9, a plurality of driving thin film transistors for driving pixel units are provided on the display panel, the ninth thin film transistor T9 is the same as the driving thin film transistors in pixel units on the display panel in structure and parameters, wherein the gate G of the ninth thin film transistor T9 is electrically connected to the gate driving circuit 10 for driving the driving thin film transistors in pixel units on the display panel, the source S of the ninth thin film transistor T9 is electrically connected to the voltage source 100, the drain D of the ninth thin film transistor T9 functioning as the output terminal of the unit to be detected 104 is electrically connected to the output terminal of the first mirror current source 101. The ninth thin film transistor T9 is positioned on the display panel, so that the turn-on voltage of the ninth thin film transistor T9 will change with the changes in temperature of the display panel.

Alternatively, the unit to be detected 104 is formed on the edge of the display panel, that is, formed in the non-display area, thus the resolution of the display area will not be affected, and the complication for designing the display panel will not be increased.

The drain D of the ninth thin film transistor T9 is electrically connected to the output terminal of the first mirror current source 101, and the current input into the second mirror current source 102 is a difference current between the output current from the first mirror current source 101 and the output current from the drain D of the ninth thin film transistor T9 on the display panel. If the current to be detected is larger than the reference current, then the inverter 103 outputs a high level voltage, which indicates that the turn-on voltage of the driving thin film transistors in the display panel should be reduced, so as to correct the turn-on voltage of the driving thin film transistors in the display panel. If the current to be detected is smaller than the reference current, then the inverter 103 outputs a low level voltage, which indicating that the turn-on voltage of the driving thin film transistor in the display panel should be increased, so as to correct the turn-on voltage of the driving thin film transistor in the display panel.

In the embodiment of the invention, the gate voltage applied to the driving thin film transistor in the pixel unit in the display panel may be compensated based on the drain current of the ninth thin film transistor, since the changes in temperature affect the turn-on voltage, thus affect the drain current. Therefore, the effect of temperature on the turn-on voltage may be reflected by the drain current. Specifically, effect of temperature on the drain current is mainly reflected in a correspondence between the threshold voltage (i.e. the turn-on voltage) and the average carrier mobility in the channel. When Vgs−Vth<Vds, then:

$$Ids = \frac{1}{2} Ueff \left(\frac{\xi_{ins}\xi_0}{t_{ins}}\right)\left(\frac{W}{L}\right)(Vgs - Vth)2 \quad (1)$$

wherein, Ids is the drain-source current, that is, current to be detected;

tins is the thickness of gate insulating layer channel;

$$\frac{\xi_{ins}\xi_0}{t_{ins}}$$

is the capacitance of gate insulating layer per unit area;

W is the thickness of the channel;
L is the length of the channel;
Vgs is the gate-source voltage;
Vds is the drain-source voltage;
Vth is the turn-on voltage, or is referred to as the threshold voltage;
Ueff is the equivalent carrier mobility.

It can be known from the equation (1) that the principle adopted in the invention for correcting the turn-on voltage of the driving thin film transistors in the display panel is as follows: when the turn-on voltage of the driving thin film transistor is affected by the changes in temperature, the corresponding drain current may also change accordingly. When the drain-source current Ids (i.e., the current to be detected) of the ninth thin film transistor in the unit to be detected as it is operating actually is measured accurately, and the relationship between the current to be detected and the drain-source current Ids (i.e., the reference current) as it is normally operating is determined, the relationship between the actual turn-on voltage of the driving thin film transistor in the display panel and the set turn-on voltage may be determined. The corrected voltage value needed for the driving thin film transistors in the display panel being able to normally operating under corresponding temperature changing condition may be obtained through the temperature compensating module, and a corrected voltage is output through the control chip to the gate driving circuit, so as to correct the turn-on voltage of the driving thin film transistor in the display panel in time, thus the display quality of the display panel may be increased.

Above description is just made for specific embodiments of the invention, but the invention is not limited thereto, a skilled in the art can easily conceive some changes and substitutes without departing from the technical scope of the invention. For example, the configurations of the mirror current source and the inverter are exemplary, a skilled in the art can configure above current detecting circuit using other forms of the mirror current source and the inverter by the teaching of the technical solutions in the invention. Alternatively, some modifications or additions may be made to those circuits disclosed in the invention so as to obtain better performance. These modifications or substitutes should be covered by the scope of the invention. Therefore, the scope of the invention should be defined by claims.

What is claimed is:

1. A current detecting circuit for detecting current of a unit to be detected, which comprises
    a voltage source, a first mirror current source, a second mirror current source and an inverter,
    wherein the first mirror current source is configured to provide a reference current, and includes an input terminal, an output terminal and a ground terminal, wherein the input terminal is electrically connected to the voltage source, and the output terminal is electrically connected to the second mirror current source;
    the second mirror current source is configured to obtain a difference between an output current of the first mirror current source and an output current of the unit to be detected and converts it into a voltage signal, and includes a first input terminal, a second input terminal, a output terminal and a ground terminal, wherein the first input terminal of the second mirror current source is electrically connected to the output terminal of the first mirror current source, and electrically connected to the output terminal of the unit to be detected, and the second input terminal of the second mirror current source is electrically connected to the voltage source;
    the inverter is configured to amplify the voltage signal and output a detection result, and includes a first input terminal, a second input terminal, an output terminal and a ground terminal, wherein the first input terminal of the inverter is electrically connected to the voltage source, the second input terminal of the inverter is electrically connected to the output terminal of the second mirror current source, and the output terminal of the inverter functions as an output terminal of the current detecting circuit.

2. The current detecting circuit according to claim 1, wherein the first mirror current source includes a first thin film transistor, a second thin film transistor and a third thin film transistor, wherein
    the gate and the source of the first thin film transistor are electrically connected together to function as the input terminal of the first mirror current source, the drain of the first thin film transistor is electrically connected to the gate and the source of the second thin film transistor respectively;

the gate of the second thin film transistor is electrically connected to the gate of the third thin film transistor, the drain of the second thin film transistor is electrically connected to the drain of the third thin film transistor to function as the ground terminal of the first mirror current source; and the source of the third thin film transistor functions as the output terminal of the first mirror current source.

3. The current detecting circuit according to claim 1, wherein the second mirror current source includes a fourth thin film transistor, a fifth thin film transistor and a sixth thin film transistor, wherein the gate and the source of the fourth thin film transistor are electrically connected together to function as the first input terminal of the second mirror current source, the gate of the fourth thin film transistor is electrically connected to the gate of the fifth thin film transistor, the drain of the fourth thin film transistor and the drain of the fifth thin film transistor are electrically connected to function as the ground terminal of the second mirror current source; the source of the fifth thin film transistor and the drain of the sixth thin film transistor are electrically connected together to function as the output terminal of the second mirror current source; and the gate and the source of the sixth thin film transistor are electrically connected together to function as the second input terminal of the second mirror current source.

4. The current detecting circuit according to claim 1, wherein the inverter includes a seventh thin film transistor and a eighth thin film transistor, wherein the source of the seventh thin film transistor functions as the first input terminal of the inverter, the gate of the seventh thin film transistor and the gate of the eighth thin film transistor are electrically connected together to function as the second input terminal of the inverter, the drain of the seventh thin film transistor and the source of the eighth thin film transistor are electrically connected together to function as the output terminal of the inverter, the drain of the eighth thin film transistor functions as the ground terminal of the inverter.

5. A temperature compensating device, which includes a temperature compensating module, a control chip, and the current detecting circuit according to claim 1, wherein the input terminal of the temperature compensating module is electrically connected to the output terminal of the current detecting circuit, and is configured to calculate a corrected voltage value based on a detection result output from the output terminal of the current detecting circuit, and output the corrected voltage value to the control chip; and the control chip controls output of corrected voltage based on the corrected voltage value.

6. The temperature compensating device according to claim 5, wherein the temperature compensating module includes an analog-digital converter and a calculating unit, the input terminal of the analog-digital converter functions as the input terminal of the temperature compensating module and is configured to convert the detection result of the current detecting circuit into a digital signal and output the digital signal to the calculating unit, and the calculating unit is configured to calculate the corrected voltage value based on the digital signal.

7. The temperature compensating device according to claim 5, wherein the first mirror current source includes a first thin film transistor, a second thin film transistor and a third thin film transistor, wherein the gate and the source of the first thin film transistor are electrically connected together to function as the input terminal of the first mirror current source, the drain of the first thin film transistor is electrically connected to the gate and the source of the second thin film transistor respectively;

the gate of the second thin film transistor is electrically connected to the gate of the third thin film transistor, the drain of the second thin film transistor is electrically connected to the drain of the third thin film transistor to function as the ground terminal of the first mirror current source; and the source of the third thin film transistor functions as the output terminal of the first mirror current source.

8. The temperature compensating device according to claim 5, wherein the second mirror current source includes a fourth thin film transistor, a fifth thin film transistor and a sixth thin film transistor, wherein the gate and the source of the fourth thin film transistor are electrically connected together to function as the first input terminal of the second mirror current source, the gate of the fourth thin film transistor is electrically connected to the gate of the fifth thin film transistor, the drain of the fourth thin film transistor and the drain of the fifth thin film transistor are electrically connected to function as the ground terminal of the second mirror current source; the source of the fifth thin film transistor and the drain of the sixth thin film transistor are electrically connected together to function as the output terminal of the second mirror current source; and the gate and the source of the sixth thin film transistor are electrically connected together to function as the second input terminal of the second mirror current source.

9. The temperature compensating device according to claim 5, wherein the inverter includes a seventh thin film transistor and a eighth thin film transistor, wherein the source of the seventh thin film transistor functions as the first input terminal of the inverter, the gate of the seventh thin film transistor and the gate of the eighth thin film transistor are electrically connected together to function as the second input terminal of the inverter, the drain of the seventh thin film transistor and the source of the eighth thin film transistor are electrically connected together to function as the output terminal of the inverter, the drain of the eighth thin film transistor functions as the ground terminal of the inverter.

10. A display device including a display panel and the temperature compensating device according to claim 5.

11. The display device according to claim 10, wherein the temperature compensating module includes an analog-digital converter and a calculating unit, the input terminal of the analog-digital converter functions as the input terminal of the temperature compensating module and is configured to convert the detection result of the current detecting circuit into a digital signal and output the digital signal to the calculating unit, and the calculating unit is configured to calculate the corrected voltage value based on the digital signal.

12. The display device according to claim 11, wherein the display panel includes a display area and a non-display area, a plurality of pixel units are provided in the display area, each pixel unit includes a driving thin film transistor for driving the pixel unit, the unit to be detected is formed in the display area, and the unit to be detected functions as a ninth thin film transistor which has same structure and parameters as those of the driving thin film transistor respectively.

13. The display device according to claim 12, wherein a gate driving circuit is further provided in the non-display area, the gate of the ninth thin film transistor is electrically connected to the gate driving circuit, the source of the ninth thin film transistor is electrically connected to the voltage source, and the drain of the ninth thin film transistor functions as the output terminal of the unit to be detected and is electrically connected to the input terminal of the current detecting circuit.

14. The display device according to claim 12, wherein the current detecting circuit is provided in the non-display area.

15. The display device according to claim 10, wherein the display panel includes a display area and a non-display area, a plurality of pixel units are provided in the display area, each pixel unit includes a driving thin film transistor for driving the pixel unit, the unit to be detected is formed in the display area, and the unit to be detected functions as a ninth thin film transistor which has same structure and parameters as those of the driving thin film transistor respectively.

16. The display device according to claim 15, wherein a gate driving circuit is further provided in the non-display area, the gate of the ninth thin film transistor is electrically connected to the gate driving circuit, the source of the ninth thin film transistor is electrically connected to the voltage source, and the drain of the ninth thin film transistor functions as the output terminal of the unit to be detected and is electrically connected to the input terminal of the current detecting circuit.

17. The display device according to claim 15, wherein the current detecting circuit is provided in the non-display area.

* * * * *